(12) United States Patent
Bruhns et al.

(10) Patent No.: US 7,015,851 B1
(45) Date of Patent: Mar. 21, 2006

(54) LINEARIZING ADCS USING SINGLE-BIT DITHER

(75) Inventors: Thomas V. Bruhns, Mukilteo, WA (US); Jason M. Pursel, Everett, WA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/973,206

(22) Filed: Oct. 26, 2004

(51) Int. Cl.
*H03M 1/12* (2006.01)

(52) U.S. Cl. .................................... 341/155; 341/131
(58) Field of Classification Search ................ 341/155, 341/131, 120
See application file for complete search history.

(56) References Cited

U.S. PATENT DOCUMENTS

| 4,903,023 | A | * | 2/1990 | Evans et al. | 341/120 |
|---|---|---|---|---|---|
| 4,996,530 | A | * | 2/1991 | Hilton | 341/120 |
| 5,189,418 | A | * | 2/1993 | Bartz et al. | 341/131 |
| 5,926,123 | A | * | 7/1999 | Ostrom et al. | 341/120 |
| 6,522,276 | B1 | * | 2/2003 | Andre et al. | 341/143 |

OTHER PUBLICATIONS

Donald E. Knuth, Stanford University—"The Art Of Computer Programming", vol. 2/Seminumerical Algorithms; Chapter Three—Random Numbers; pp. 1-34, no date.

Xilinx—Application Note by Peter Alfke—"Efficient Shift Registers, LFSR Counters, And Long Pseudo-Random Sequence Generators"; XAPP 052 Jul. 7, 1996 (version 1.1); pp. 1-6.

* cited by examiner

*Primary Examiner*—Jean Bruner Jeanglaude
(74) *Attorney, Agent, or Firm*—Robert T. Martin

(57) ABSTRACT

Linearizing analog to digital converter (ADC) performance using single-bit dither. Dither is summed with an input signal to an ADC by passing a serial pseudo-random bitstream through an analog filter. Dither is removed through applying correlation and digital filtering to the ADC digital output.

10 Claims, 2 Drawing Sheets

LINEARIZING ADCS USING SINGLE-BIT DITHER

TECHNICAL FIELD

Embodiments in accordance with the invention relate generally to analog to digital conversion, and more particularly, to linearizing the performance of analog to digital converters (ADCs) using dithering.

BACKGROUND

Analog to digital converters (ADCs) are an important building block of modern electronic systems, and are the gateway between analog and digital worlds. The ideal analog to digital converter would be perfectly linear, perfectly repeatable, have zero aperture time, be noise free, convert at very high speeds, and of course consume very little power. Such ADCs are hard to find.

One of the problems involved with ADCs, linearity, has been addressed using dithering techniques. In dithering, a known analog signal is added, in the analog domain, to the signal to be digitized. This analog signal is typically generated from a digital source using a digital to analog converter (DAC) and supporting circuitry.

Introduced dither corrupts the input signal. Mathematically, if the dither signal added to the input signal is known, it can be removed from the ADC digital output, resulting in a representation of the input signal with the dither portion canceled out.

Such dithering techniques rely on the accuracy of a multiple-bit digital to analog converter (DAC) used to convert the dither signal from digital to analog form. The DAC and its supporting circuitry must be high speed, linear, noise free, and accurate. Errors in the DAC and its supporting circuitry make the dither removal process more difficult, or impossible.

What is needed is a dithering technique that eliminates the need for a multiple-bit digital to analog converter.

SUMMARY

In accordance with the invention, analog dither is generated for an analog to digital converter by passing a serial pseudorandom bit sequence through an analog filter. The resulting signal is added to the ADC input in the analog domain. Correlation and adaptive filtering techniques remove the dither signal from the digital output of the ADC.

BRIEF DESCRIPTION OF THE DRAWINGS

The invention will best be understood by reference to the following detailed description of embodiments in accordance with the invention when read in conjunction with the accompanying drawings, wherein.

DETAILED DESCRIPTION

The invention relates to dithering in analog to digital converters (ADCs). The following description is presented to enable one skilled in the art to make and use the invention, and is provided in the context of a patent application and its requirements. Various modifications to the disclosed embodiments will be readily apparent to those skilled in the art, and the generic principles herein may be applied to other embodiments. Thus, the invention is not intended to be limited to the embodiments shown but is to be accorded the widest scope consistent with the appended claims and with the principles and features described herein.

Figure 1:
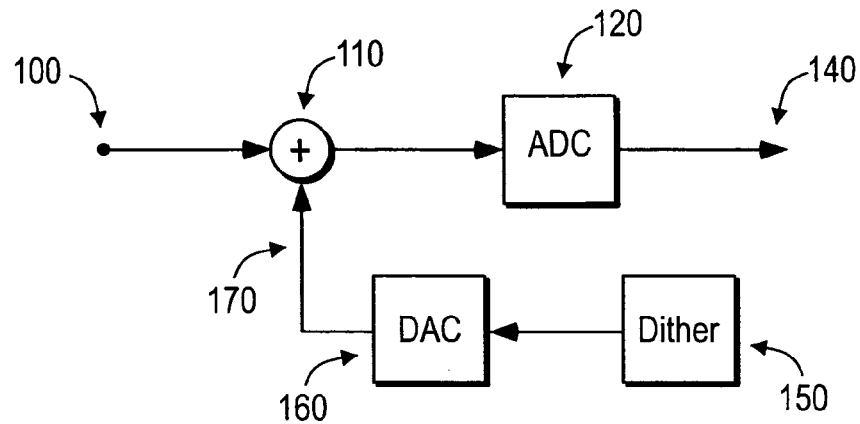
FIG. 1 shows a first block diagram of a dithered ADC as known to the art.

The use of dither to linearize the response of an analog to digital converter (ADC) is known to the art. FIG. 1 shows a block diagram of a dithered ADC as known to the art. Analog input 100 is to be converted to digital output 140. Analog input 100 passes to analog summing junction 110. The output of analog summing junction 110 feeds the analog input of analog to digital converter (ADC) 120. The digital output of ADC 120 produces digital output 140. The digital output of ADC 120, digital output 140 may be in bit-serial or bit-parallel form. Note that clock signals are omitted for clarity.

Dither is produced as a multi-bit digital signal by dither generator 150. This multi-bit digital signal representing a dither signal is passed to digital to analog converter (DAC) 160, which produces analog dither signal 170. It is this analog dither signal 170 which is added, again in analog form, to analog input 100 at analog summing junction 110, forming the analog input to ADC 120.

In a first technique known to the art, dither signal 170 is band-limited to a frequency band outside the frequency range of the signals of interest being digitized, so that the dither signal does not interfere with the signals of interest. This technique requires complex generation or filtering of dither signal 170, or the use of a suboptimal waveform for the dither signal.

In a second technique known to the art, broadband dither is generated at a very low amplitude, without interfering significantly with the signals of interest, but the linearization benefit is limited by the low dither amplitude, and the technique is not useful for all possible signals of interest because of the raised noise level. In such an implementation, the introduced dither is a broadband signal with very little energy per unit bandwidth.

Figure 2:
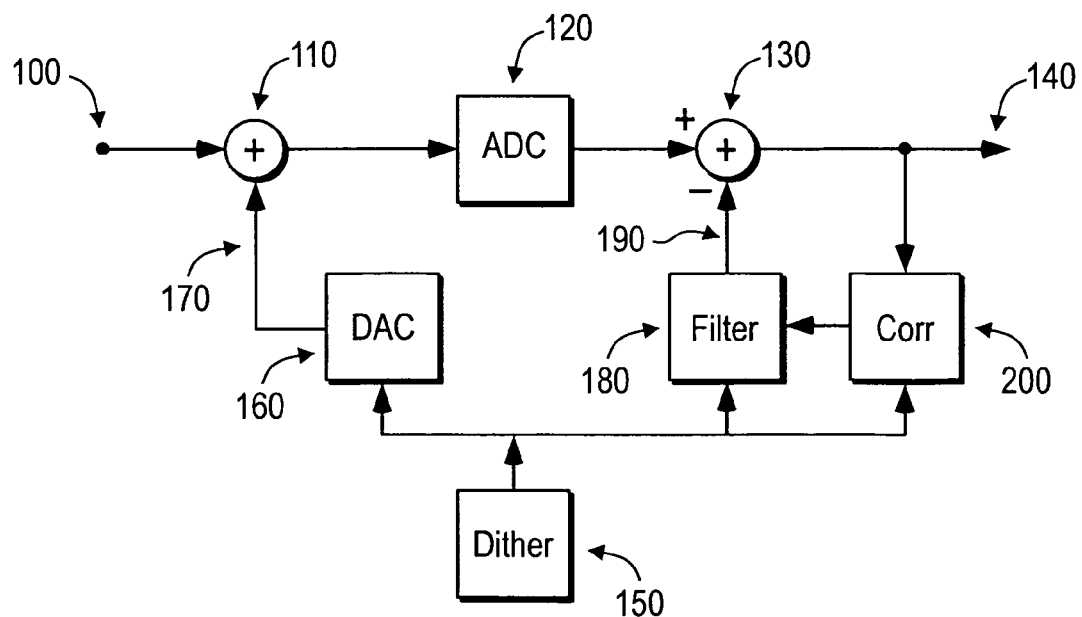
FIG. 2 shows a second block diagram of a dithered ADC as known to the art.

FIG. 2 shows a block diagram of a second dithered ADC as known to the art. Analog input 100 is to be converted to digital output 140. Analog input 100 passes to analog summing junction 110. The output of analog summing junction 110 feeds the analog input of analog to digital converter (ADC) 120. The digital output of ADC 120 passes to digital adder 130, producing digital output 140. The digital output of ADC 120, adder 130, and digital output 140 may be in bit-serial or bit-parallel form. Note that clock signals are omitted for clarity.

Dither is produced as a multi-bit digital signal by dither generator 150. This multi-bit digital signal representing a dither signal is passed to digital to analog converter (DAC) 160, which produces analog dither signal 170. It is this analog dither signal 170 which is added, again in analog form, to analog input 100 at analog summing junction 110, forming the analog input to ADC 120. The multi-bit digital output of dither generator 150 also passes to digital adaptive filter 180, which produces digital correction value 190, which is added 130 to the digital output of ADC 120. In advanced dithering systems, correlator 200, also driven by dither generator 150, samples digital output 140, producing correction signals to digital adaptive filter 180. The design of digital filter 180 and of correlator 200 are known to the art, taught, for example, in U.S. Pat. No. 4,996,530 to Hilton, incorporated herein by reference.

In this technique, higher amplitude broadband dither may be applied to the analog input of ADC 120, and knowing what dither value was applied, this dither is removed digitally through the use of digital filtering 180 and correlation 200.

The three approaches described rely on a multi-bit digital to analog converter (DAC) 160, and rely upon the accuracy and linearity of that DAC and its surrounding circuitry. They rely upon the accurate conversion of the multi-bit dither value produced by dither generator 150 to an analog value. Differences between the multi-bit dither value 150 and its analog representation 170 will be reflected as added noise and errors in the digital output 140 of the analog to digital converter.

Figure 3:
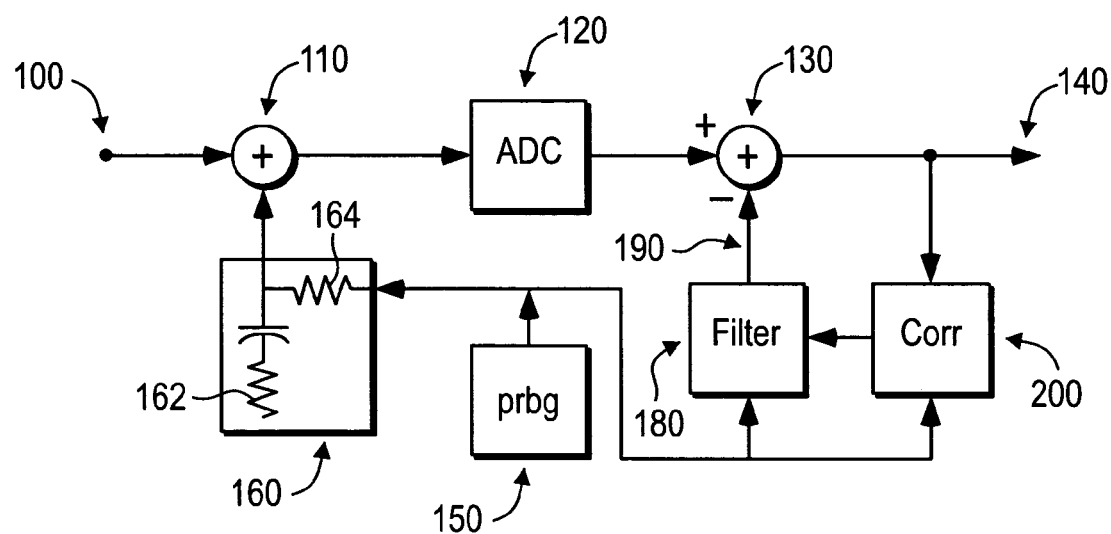
FIG. 3 shows a second block diagram of a dithered ADC incorporating the invention.

An embodiment of the present invention is shown in block form in FIG. 3. Analog input 100 passes to analog summing junction 110. The output of summing junction 110 feeds the analog input of analog to digital converter 120. The digital output of ADC 120 passes to digital adder 130, producing digital output 140.

In this embodiment of the present invention, the dither signal is provided by serial pseudo-random bitstream generator (PRBG) 150. PRGB generates a pseudorandom, uncorrelated single bit with each clock period. In this application, each pseudorandom bit is uncorrelated to other bits in the pseudorandom bitstream, and also uncorrelated to input signal 100.

Generation of pseudorandom numbers and pseudorandom bit sequences is well known to the art. The generation and testing of pseudorandom numbers is explored in great depth in *Chapter 3—Random Numbers* in the well known reference work *The Art of Computer Programming, Seminumerical Algorithms* by Donald Knuth, pp 1–34.

One approach to generating pseudorandom numbers for use in the present invention is through the use of a linear congruence generator. Well known to the art, if Rn is the current sample, the next sample, $R_{n+1}$ is generated as:

$$R_{n+1} = (aR_{n+c}) \bmod m$$

This approach is useful in implementations where parallel arithmetic is available, such as in DSP-based implementations. In such an implementation, a pseudorandom value is calculated, and one or more bits of that value are then shifted out in bit-serial fashion to provide the serial pseudorandom bit sequence required.

Techniques such as linear feedback shift register (LFSR) generators may also be used to generate the serial pseudo-random bit sequence required. An n-bit LFSR can have a maximum sequence length of ($2^n-1$). Such a generator is constructed from a clocked n-bit binary shift register having an exclusive-or (XOR or XNOR) feedback path tapped from certain stages of a binary shift register. While embodiments using binary shift registers are popular, it is also possible to use shift registers whose stages each have m possible states, rather than just (0,1) states of a binary shift register, and use modulo-m summation of several stages to produce a pseudorandom result. Xilinx Application Note XAPP 052, Jul. 7, 1996 describes LFSR generators and maximal length taps for sequences up to 168 bits. Even when clocked at a very high speed, it takes a while to repeat a sequence ($2^{168}-1$) clock cycles long.

Many test instruments have in-built noise sources for use in making measurements. Such a digital noise source may be used for generator 150 as long as sequential bits of the noise source are uncorrelated, and the noise source is uncorrelated with the input signal.

In the present invention, pseudo-random bitstream generator 150 outputs one new uncorrelated bit for each clock cycle K. The digital bitstream from PRBG 150 feeds analog filter 160, which by example may comprise resistor 164 and capacitor 162 forming a single-pole filter. While the present invention is presented using a single pole analog filter, higher order analog filters may be used. This analog filter may be considered to be an analog memory. In the embodiment shown, single-pole analog filter 160 is designed so that the filter output due to all previous inputs decays to half its value in one clock period. Consider the PRBG output at time n to be r(n). Then the analog output 170 of single-pole analog filter 160 at time n is proportional to $r(n)+2^{(-)}*r(n-1)+2^{(-2)}*r(n-2)+ \ldots +2^{(-k)}*r(n-k)$. Since each bit r(n) is uncorrelated with other bits, the definition of a pseudorandom sequence, the analog output 170 of single pole analog filter 160 has a uniform amplitude distribution.

The analog filter output 170 is summed 110 with analog input signal 100 and the analog sum fed to the input of ADC 120.

This dither signal from PRBG 150 is also fed to digital filter 180. Digital filter 180 digitally emulates the path of the dither signal from PRBG 150 through single pole analog filter 160, summing node 110, and analog to digital converter 120, so that the output of filter 180, when subtracted 130 from the output of ADC 120 creates output 140 free from dither. Subtracting the digital output of filter 180 from the digital output of ADC 120 may be performed by using an adder at node 130 and having filter 180 produce a value with the appropriate sign, or a subtracter may be used for node 130. Digital filter 180 acts as the digital equivalent to analog filter 160, including also whatever additional gain, frequency shaping, and delays are present in the signal path to the output of ADC 120. When the order or shape of analog filer 160 is changed to meet a particular implementation, digital filter 180 is changed accordingly.

An adaptive filter may be used for filter 180, tracking for example variations caused by temperature in analog filter 160, summing node 110, and ADC 120. Correlator 200 monitors output 140 for residual dither, providing feedback to filter 180.

The foregoing detailed description of the present invention is provided for the purpose of illustration and is not intended to be exhaustive or to limit the invention to the precise embodiments disclosed. Accordingly the scope of the present invention is defined by the appended claims.

What is claimed is:

1. An improved analog to digital converter for converting an analog signal to a corrected digital output, comprising:

an analog summing node having a first analog input, a second analog input, and an analog output, the analog signal connected to the first analog input of the analog summing node, the output of the analog summing node connected to the analog input of an analog to digital converter, a digital summing node having a first digital input, a second digital input, and a digital output, the digital output of the analog to digital converter connected to the first digital input of the digital summing node, a pseudorandom bitstream generator producing a serial digital bitstream, the serial digital bitstream feeding an analog filter, the output of the analog filter connected to the second analog input of the analog summing node, the serial bitstream feeding a digital filter, the output of the digital filter feeding the second digital input of the digital summing node, and the output of the digital summing node providing the corrected digital output.

2. The improved analog to digital converter of claim 1 where the analog filter is a single pole analog filter.

3. The improved analog to digital converter of claim 1 where the analog filter is a multiple-pole analog filter.

4. The improved analog to digital converter of claim 1 where the digital filter is a fixed filter.

5. The improved analog to digital converter of claim 1 where the digital filter is an adaptive filter.

6. The improved analog to digital converter of claim 1 where the digital filter is an adaptive filter including a correlator.

7. The improved analog to digital converter of claim 1 where the pseudorandom bitstream generator produces a serial digital bitstream in which sequential bits are uncorrelated.

8. The improved analog to digital converter of claim 1 where the pseudorandom bitstream generator produces a serial digital bitstream which is uncorrelated with the input signal.

9. The improved analog to digital converter of claim 1 where the pseudorandom bitstream generator is a linear congruence generator.

10. The improved analog to digital converter of claim 1 where the pseudorandom bitstream generator is a linear feedback shift register generator.

* * * * *